US006190823B1

(12) United States Patent
Suzukawa et al.

(10) Patent No.: US 6,190,823 B1
(45) Date of Patent: Feb. 20, 2001

(54) DIAZO-CONTAINING PHOTOSENSITIVE MATERIAL

(75) Inventors: Yoko Suzukawa, Urawa; Nobue Abiko, Yono; Hiroshi Maruyama, Misato, all of (JP)

(73) Assignee: Somar Corporation (JP)

( * ) Notice: Under 35 U.S.C. 154(b), the term of this patent shall be extended for 0 days.

(21) Appl. No.: 09/509,501

(22) PCT Filed: Jul. 3, 1999

(86) PCT No.: PCT/JP99/04133

§ 371 Date: Jun. 5, 2000

§ 102(e) Date: Jun. 5, 2000

(87) PCT Pub. No.: WO00/07070

PCT Pub. Date: Feb. 10, 2000

(30) Foreign Application Priority Data

Jul. 31, 1998 (JP) ........................................ 10-217206

(51) Int. Cl.[7] ........................................ G03F 7/021
(52) U.S. Cl. ........................ 430/157; 430/173; 430/181
(58) Field of Search ........................ 430/157, 173, 430/181

(56) References Cited

U.S. PATENT DOCUMENTS 4,171,222 * 10/1979 Frommeld ........................ 430/171
4,457,997 * 7/1984 Thoese et al. ........................ 430/160
4,555,468 * 11/1985 Yano et al. ........................ 430/160
5,124,227 * 6/1992 Hodgins et al. ........................ 430/162
5,382,495 * 1/1995 Niziolek et al. ........................ 430/162

FOREIGN PATENT DOCUMENTS 50-75421 6/1975 (JP) .
2-154250 6/1990 (JP) .
4-076461 3/1992 (JP) .
7-168306 7/1995 (JP) .

* cited by examiner

*Primary Examiner*—John S. Chu
(74) *Attorney, Agent, or Firm*—Lorusso & Loud

(57) ABSTRACT

A diazo-containing photosensitive material comprising a transparent support, and a diazo-containing photosensitive layer provided over a surface of the support and containing a binder, a diazo compound and a coupler, wherein the diazo compound is represented by the following formula:

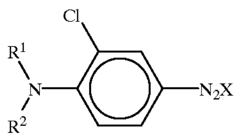

(wherein $R^1$ and $R^2$ stand, independently from each other, for a lower alkyl group and X stands for an anionic group), wherein the coupler comprises phenylphenol and 3,5-dihydroxy-4-bromobenzoic acid, and wherein the binder comprises a cellulose ester cross-linked with a lower-alkylated urea resin.

3 Claims, No Drawings

DIAZO-CONTAINING PHOTOSENSITIVE MATERIAL

TECHNICAL FIELD

The present invention relates to a diazo-containing photosensitive material useful for the fabrication of photomasks.

BACKGROUND ART

It is known to use a photosensitive material having a transparent film on which a diazo-containing photosensitive layer capable of affording a light-shielding colored image as a photomask for the fabrication of printed wiring boards and various printing plates.

In the fabrication of a printed wiring board, a photosensitive resin layer is formed over a conductive layer such as a copper clad laminate. A photomask is superimposed on the photosensitive resin layer. Then, the photosensitive resin layer is exposed through the photomask using a contact printing device. The exposed photosensitive resin layer is developed to form a pattern. The conductive layer is then etched according to the pattern. The remaining photosensitive layer is thereafter removed to give a desired wiring pattern. The contact printing step has a great influence upon resolution of images and working efficiency in the production of printing wiring boards. In particular, when the photomask is not closely contacted with the photosensitive resin layer, Newton rings and air entrainment occur to cause cutting or distortion of wiring patterns. Thus, it is necessary to evacuate air between the photomask and the photosensitive resin layer for a long period of time in order to obtain good contact therebetween.

JP-A-H07-168306 discloses a diazo-containing photosensitive material having a transparent support, and a diazo-containing photosensitive layer provided over a surface of the support and including a binder, a diazo compound, a coupler and solid powder having an average particle diameter of 1–8 μm, wherein the diazo compound is represented by the following formula:

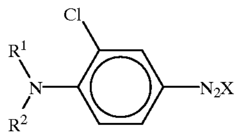

(wherein $R^1$ and $R^2$ stand, independently from each other, for a lower alkyl group and X stands for an anionic group), and wherein the coupler comprises phenylphenol and N-(2'-hydroxyalkyl)-β-resorcylamide. It has been found that a photomask obtained from the diazo-containing photosensitive material encounters a problem that the diazo-containing photosensitive layer, when contacted with a photosensitive resin layer during contact printing stage, is affected by monomers or a solvent contained in the photosensitive resin layer to cause deterioration of the durability of the diazo-containing photosensitive layer and lowering of pattern resolution. It has been also found that a surface of the diazo-containing photosensitive layer is apt be injured by frictional contact with working tables or with another diazo-containing photosensitive material during operation or storage.

U.S. Pat. No. 5,382,495 discloses a photosensitive material having an overcoat layer provided on a diazo-containing photosensitive layer so as to improve resistance to solvents and resistance to injury. When a latent image is produced on a photosensitive resin layer using a photomask obtained from the above photosensitive material, a problem of a reduction of the resolution of the image produced on the photosensitive resin layer is caused due to the presence of the overcoat layer between the photosensitive resin layer and the diazo-containing photosensitive layer. Another problem is also caused because it is very difficult to produce the diazo-containing photosensitive material.

It is an object of the present invention to provide a photosensitive material having a diazo-containing photosensitive layer, whose photosensitive layer has good resistance to solvents and to injury, which provides good contact with an original image film and with a photosensitive resin layer on a copper clad laminate layer, which is capable of affording a photomask that requires only a short period of time for removing air between the photomask and the photosensitive resin layer by suction, which gives a background (transparent portion) having good UV permeability, and which gives images having high resolution and excellent UV-shielding properties.

DISCLOSURE OF THE INVENTION

In accordance with the present invention there is provided a diazo-containing photosensitive material comprising a transparent support, and a diazo-containing photosensitive layer provided over a surface of said support and comprising a binder, a diazo compound and a coupler, wherein said diazo compound is represented by the following formula:

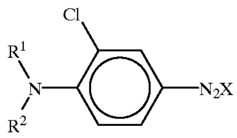

wherein $R^1$ and $R^2$ stand, independently from each other, for a lower alkyl group and X stands for an anionic group, wherein said coupler comprises phenylphenol and 3,5-dihydroxy-4-bromobenzoic acid, and wherein said binder comprises a cellulose ester crosslinked with a lower-alkylated urea resin.

As the binder for the diazo-containing photosensitive material according to the present invention, there may be used a cellulose ester crosslinked with a lower-alkylated urea resin. A cellulose ester is excellent not only in transparency but also in permeability of ammonia used in development of an image-exposed material. Illustrative of suitable cellulose esters are cellulose diacetate, cellulose triacetate, cellulose acetate propionate, cellulose propionate, cellulose acetate and cellulose acetate butyrate. Above all, use of cellulose acetate propionate is preferred for reasons of transparency.

A lower-alkylated urea resin is a thermosetting product obtained by reacting a precondensate (such as dimethylol urea or its dimeric condensate) having a methylol group, obtained by condensing urea with formaldehyde, with a lower alcohol to convert the methylol group into an ether group. In the condensation reaction, formaldehyde is used in an amount of 0.5–4.0 moles, preferably 1.3–2.3 moles, per mole of urea. The lower alcohol has 1–6 carbon atoms. Butyl alcohol is preferably used. The lower-alkylated urea resin is used in the form of a powder or a solution (aqueous solution or a xylol/butanol solution). Such a lower-alkylated urea resin is commercially available as a trade name of "UVAN 10S60", which is suitably used for the purpose of the present invention.

The diazo-containing photosensitive material obtained with the use of the lower-alkylated urea resin as a crosslinking agent has good resistance to solvents from a photosensitive resin layer and to surface injury. The crosslinking agent does not react with a diazo compound or a coupler and, thus, does not interfere the light transmission through non-image portions. Further, since the crosslinking agent permits crosslinking at a temperature of 120° C. or less, it is possible to suppress the coloration of the diazo-containing material during the preparation thereof.

The lower-alkylated urea resin crosslinking agent is generally used in an amount of 3–150 parts by weight per 100 parts by weight of the cellulose ester. An amount of the crosslinking agent below the above range causes a reduction of solvent resistance and injury resistance of the diazo-containing photosensitive layer. Too large an amount in excess of the above range causes lowering of the ammonia permeability, resulting in a reduction of development speed and in insufficient development. For reasons of solvent resistance, injury resistance and development efficiency of the diazo-containing photosensitive layer, it is preferred that the crosslinking agent be used in an amount of 10–100 parts by weight, more preferably 20–60 parts by weight, per 100 parts by weight of the cellulose ester.

Crosslinking of the cellulose ester with the lower-alkylated urea resin is based on an ether-forming reaction between the N-methylol groups contained in the lower-alkylated urea resin and hydroxyl groups contained in the cellulose ester.

In the present invention, an acid catalyst may be used to facilitate the crosslinking of the cellulose ester with the lower-alkylated urea resin. Examples of acid catalysts include citric acid, tartaric acid, sulfosalicylic acid and p-toluenesulfonic acid. Above all, the use of p-toluenesulfonic acid is preferred.

In the diazo compound of the formula shown above, the alkyl groups $R^1$ and $R^2$ may be a lower alkyl group having 1–6 carbon atoms, such as a methyl group, an ethyl group, a propyl group or a butyl group. These alkyl groups $R^1$ and $R^2$ may be the same or different from each other. Illustrative of suitable anionic group X are $PF_6$, $BF_4$, Cl, $1/2ZnCl_2$.

As a coupler for the diazo compound, a combination of phenylphenol with 3,5-dihydroxy-4-bromobenzoic acid is used. The phenylphenol is represented by the following formula:

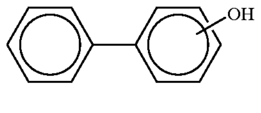

wherein the position of the hydroxyl group may be ortho, meta or para position, preferably ortho position. The phenylphenol is mainly used for obtaining a yellow colored image having UV-shielding properties.

3,5-Dihydroxy-4-bromobenzoic acid is a phenol compound represented by the following formula:

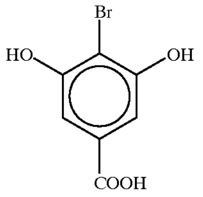

and adapted to give a brown color to enhance pattern discriminativity.

In the present invention, the amount of the coupler (total amount of phenylphenol and 3,5-dihydroxy-4-bromobenzoic acid) is 0.8–2.5 moles, preferably 1.2–1.6 moles, per mole of the diazo compound. The molar ratio of 3,5-dihydroxy-4-bromobenzoic acid to phenylphenol (3,5-dihydroxy-4-bromobenzoic acid:phenylphenol) is 80:20 to 99:1, preferably 85:15 to 95:5.

If desired, solid fine powder having an average particle diameter (according to Coulter counter method) of 1–8 μm may be incorporated into the diaxo-containing photosensitive layer, whereby the time required for removing air between the photomask and a photosensitive resin layer by suction during a contact printing stage can be reduced. Additionally, since the surface of the photosensitive layer shows fine surface roughness, it becomes easy to distinguish the surface from the back surface. The amount of the solid powder in the photosensitive layer is in the range of 0.1–5% by weight, preferably 1–4% by weight. When the particle diameter exceeds 8 μm, the resulting material shows increased irregular reflection due to the solid powder so that it is difficult to obtain a material having good light transmissivity. On the other hand, when the particle size is smaller than 1 μm, desired surface roughness of the photosensitive layer cannot be obtained. As a consequence, it is not possible to reduce the time required for removing air between the photomask and a photosensitive resin layer by suction. When the amount of the solid powder exceeds 5% by weight, the light transmissivity of the material becomes poor. Further, it is difficult to obtain desired surface roughness of the photosensitive layer. As a consequence, it is difficult to perform contact printing of high resolution images. An amount of the solid powder below 0.1% by weight is insufficient to reduce the time required for removing air between the photomask and a photosensitive resin layer by suction.

As the solid powder, organic or inorganic fine powder may be used. Examples of the solid powder include inorganic fine powder such as silica, clay, talc, alumina, calcium carbonate and titanium oxide, and organic fine powder such as polyethylene, polypropylene, polystyrene, an acrylate/styrene copolymer, a methacrylate/styrene copolymer, a urea resin, a melamine resin, a guanamine resin and a benzoguanamine resin.

The diazo-containing photosensitive material may be obtained by applying a coating liquid containing the above-described binder, crosslinking agent, diazo compound, coupler and acid catalyst onto a transparent support, followed by drying. A solvent used for the coating liquid may be any conventionally used one, such as water, alcohol, methyl ethyl ketone, methyl cellosolve or dimethylformamide. The coating liquid may contain customarily employed additives such as a stabilizing agent (e.g. citric acid, tartaric acid, sulfosalcylic acid or p-toluenesulfonic acid), an antioxidizing agent (e.g. thiourea or diphenylthiourea), a UV absorbing agent, a dye, a surfactant and antistatic agent.

As the transparent support, there may be used, for example, a polyester film, a polyamide film, a polyvinyl chloride film, a polypropylene film, a tracing paper or a cellulose triacetate film. The transparent support has a thickness of 25–250 μm, preferably 100–200 μm. The photosensitive layer formed on the transparent substrate is generally 1–30 μm, preferably 5–15 μm.

In the present invention, a chemical coating layer may be provided on a side of the support opposite the diazo-containing photosensitive layer, if desired. The chemical coating layer is formed of a binder such as a thermoplastic resin, a thermosetting resin or a light-curable resin. Examples of the binder resins include cellulose resins, acrylate resins, melamine resins, urethane resins, polyester resins and vinyl chloride resins. If desired, a matting agent may be incorporated into the chemical coating layer. The matting agent may be inorganic powder such as silica, zirconia, clay, kaolin, alumina, titania, zeolite, calcium carbonate, barium sulfate, magnesium hydroxide, calcium phosphate and glass, or a synthetic resin powder such as an acrylate resin, an urethane resin, a vinyl chloride resin, a benzoguanamine resin or a benzoguanamine/melamine/formaldehyde condensation product.

The thickness of the chemical coating layer is suitably selected to obtain a curl preventing characteristic and is generally 0.1–10 μm, preferably 1–5 μm. If desired, the chemical coating layer can contain conventionally employed additives, such as a surfactant, a lubricant and a stabilizing agent.

The following examples will further illustrate the present invention.

Physical properties of diazo-containing photosensitive materials are evaluated according to the methods shown below.

(1) Resistance to Injury

Pencil scratch test (hand writing method) is measured in accordance with JIS K5400.

(2) Resistance to Solvent

A surface of coated layer is rubbed with an absorbent cotton impregnated with methyl ethyl ketone. The state of the rubbed surface is observed with naked eyes. Evaluation is made based on the following ratings.

5: coat is not deteriorated (delaminated) by 100 or or more rubbing operations

4: coat is delaminated by 99-60 rubbing operations

3: coat is delaminated by 59-30 rubbing operations

2: coat is delaminated by 29-10 rubbing operations

1: coat is delaminated by 9 or less rubbing operations (3) Color

Color of the image is observed with naked eyes.

EXAMPLE 1

One side of a polyester film having a thickness of 175 μm is applied with a coating liquid having the formulation shown below with a wire bar. The coated layer was dried at 100° C. for 3 minutes to obtain a diazo-containing photosensitive film having a photosensitive layer with a thickness of 10 μm.

| Coating Liquid | |
|---|---|
| Methyl ethyl ketone | 37 parts by weight |
| Propylene glycol monomethyl ether | 37 parts by weight |
| Synthetic silica (average diameter: 3.5 μm) | 0.4 part by weight |
| Cellulose acetate propionate | 12 parts by weight |

-continued

| Coating Liquid | |
|---|---|
| Butylated urea resin (solid matter content: 60 wt %) | 8 parts by weight |
| p-Toluenesulfonic acid (hydrate) | 0.4 part by weight |
| Sulfosalicylic acid | 0.2 part by weight |
| Thiourea | 0.4 part by weight |
| Zinc chloride | 0.4 part by weight |
| o-Phenylphenol | 2.0 parts by weight |
| Coupler of the formula (II) | 0.2 part by weight |
| Diazo compound of the formula (I) (in which $R^1$ and $R^2$ are $CH_3$ and X is $PF_6$) | 2.0 parts by weight |

The above butylated urea resin is a solution containing 60% by weight of solid matters and is sold by Mitsui Chemical Corporation under a trade name "UVAN 10S60".

EXAMPLE 2

A diazo photosensitive film was prepared in the same manner as described in Example 1 except that cellulose acetate propionate was used in an amount of 15 parts by weight, butylated urea resin (solid matter content: 60 wt %) was used in an amount of 3 parts by weight, and p-toluenesulfonic acid hydrate was used in an amount of 0.15 part by weight. The physical properties of this photosensitive film are shown in Table 1.

EXAMPLE 3

A diazo photosensitive film was prepared in the same manner as described in Example 1 except that cellulose acetate propionate was used in an amount of 8.5 parts by weight, butylated urea resin (solid matter content: 60 wt %) was used in an amount of 13.5 parts by weight, and p-toluenesulfonic acid hydrate was used in an amount of 0.68 part by weight. The physical properties of this photosensitive film are shown in Table 1.

Comparative Example 1

A diazo photosensitive film was prepared in the same manner as described in Example 1 except that no crosslinking agent was used and that cellulose acetate propionate was used in an amount of 16.8 parts by weight. The physical properties of this photosensitive film are shown in Table 1.

Comparative Example 2

A diazo photosensitive film was prepared in the same manner as described in Example 1 except that a butylated melamine resin was substituted for the butylated urea resin. The physical properties of this photosensitive film are shown in Table 1.

TABLE 1

| | Injury resistance | Solvent resistance | Color |
|---|---|---|---|
| Example 1 | 4H | 5 | brown |
| Example 2 | 3H | 4 | brown |
| Example 3 | 4H | 5 | brown |
| Comp. Ex. 1 | 2H | 1 | brown |
| Comp. Ex. 2 | 2H | 2 | light brown |

What is claimed is:

1. A diazo-containing photosensitive material comprising a transparent support, and a diazo-containing photosensitive layer provided over a surface of said support and comprising a binder, a diazo compound and a coupler, wherein said diazo compound is represented by the following formula:

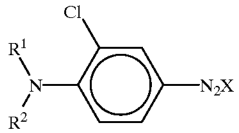

wherein $R^1$ and $R^2$ stand, independently from each other, for a lower alkyl group and X stands for an anionic group, wherein said coupler comprises phenylphenol and 3,5-dihydroxy-4-bromobenzoic acid, and wherein said binder comprises a cellulose ester cross-linked with a lower-alkylated urea resin.

2. A diazo-containing photosensitive material as recited in claim 1, wherein the amount of said lower-alkylated urea resin is in the range of 3–150 parts by weight per 100 parts by weight of said binder.

3. A diazo-containing photosensitive material as recited in claim 1, wherein said photosensitive layer additionally contains solid fine powder having an average diameter of 1–8 μm.

* * * * *

UNITED STATES PATENT AND TRADEMARK OFFICE
CERTIFICATE OF CORRECTION

PATENT NO. : 6,190,823 B1
DATED : February 20, 2001
INVENTOR(S) : Suzukawa et al.

It is certified that error appears in the above-identified patent and that said Letters Patent is hereby corrected as shown below:

Title page,
Item "[22] PCT Filed: July 3, 1999" should read -- [22] PCT Filed: July 30, 1999 --.

Signed and Sealed this

Twenty-sixth Day of February, 2002

*Attest:*

JAMES E. ROGAN

*Attesting Officer*

*Director of the United States Patent and Trademark Office*